US012588149B2

(12) United States Patent
Li et al.

(10) Patent No.: US 12,588,149 B2
(45) Date of Patent: Mar. 24, 2026

(54) GDDR MEMORY EXPANDER USING CMT CONNECTOR

(71) Applicant: Intel Corporation, Santa Clara, CA (US)

(72) Inventors: Xiang Li, Portland, OR (US); Konika Ganguly, Portland, OR (US); Tongyan Zhai, Portland, OR (US); George Vergis, Portland, OR (US); Anthony M. Constantine, Portland, OR (US); Jun Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 709 days.

(21) Appl. No.: 17/871,542

(22) Filed: Jul. 22, 2022

(65) Prior Publication Data

US 2023/0007775 A1 Jan. 5, 2023

Related U.S. Application Data

(60) Provisional application No. 63/348,956, filed on Jun. 3, 2022.

(51) Int. Cl.
*H05K 1/11* (2006.01)
*H01L 25/065* (2023.01)
(Continued)

(52) U.S. Cl.
CPC ............. *H05K 1/182* (2013.01); *H05K 1/116* (2013.01); *H05K 2201/10159* (2013.01)

(58) Field of Classification Search
CPC .. G11C 5/04; H01R 12/7082; H01R 13/2407; H05K 1/116; H05K 1/141; H05K 1/144;
(Continued)

(56) References Cited

U.S. PATENT DOCUMENTS 6,241,531 B1 6/2001 Roath et al.
6,354,844 B1 3/2002 Coico et al.
(Continued)

FOREIGN PATENT DOCUMENTS

CN 113059811 A * 7/2021 ............. B33Y 50/02
JP 3208606 B2 9/2001

OTHER PUBLICATIONS

Dell's DDR5 Camm Appears in More Detail_TheLostSwede_Apr. 1-15, 2022.*

(Continued)

*Primary Examiner* — Timothy J Thompson
*Assistant Examiner* — Guillermo J Egoavil
(74) *Attorney, Agent, or Firm* — Compass IP Law PC

(57) ABSTRACT

Methods and apparatus for GDDR (Graphics Double Date Rate) memory expander using compression mount technology (CMT) connectors. A CMT connector with a dedicated pinout for GDDR-based memory is provided that enables end users and manufacturers to change the amount of GDDR memory provided with a GPU card, accelerator card, or apparatus having other form factors. Memory could also be replaced in the event of a failure. In addition, embodiments are disclosed that support a split channel concept where there could be multiple devices (e.g., GDDR modules) with dedicated signals routed to each module.

20 Claims, 7 Drawing Sheets

(51) Int. Cl.
  *H05K 1/18* (2006.01)
  *H05K 1/182* (2026.01)

(58) Field of Classification Search
  CPC . H05K 1/182; H05K 1/11; H05K 1/18; H05K 2201/042; H05K 2201/10159; H05K 2201/10378; H05K 2201/10409; H05K 1/181; H05K 2201/10189; G06F 13/4068; G06F 13/409; H01L 25/0652; H01L 25/0655; H01L 25/0657; H01L 25/18; H01L 25/065; H01L 2225/06572; H10B 12/00
  USPC ...................................... 361/767; 365/230.06
  See application file for complete search history.

(56) References Cited

U.S. PATENT DOCUMENTS

| | | | |
|---|---|---|---|
| 7,427,809 | B2 | 9/2008 | Salmon |
| 12,349,274 | B2 | 7/2025 | Rao et al. |
| 2013/0055192 | A1 | 2/2013 | Colbert et al. |
| 2015/0171535 | A1 | 6/2015 | Li et al. |
| 2016/0056560 | A1 | 2/2016 | Farkas et al. |
| 2017/0069369 | A1 | 3/2017 | Kim et al. |
| 2019/0051641 | A1 | 2/2019 | Lee et al. |
| 2020/0019519 | A1 | 1/2020 | Johnson et al. |
| 2020/0388598 | A1 | 12/2020 | Azeroual et al. |
| 2021/0321516 | A1* | 10/2021 | Rao ........................ H05K 1/111 |
| 2021/0408704 | A1 | 12/2021 | Li et al. |
| 2022/0028848 | A1 | 1/2022 | Baek |
| 2022/0344309 | A1* | 10/2022 | Schnell .............. H01L 25/0652 |
| 2022/0394853 | A1 | 12/2022 | Shi et al. |
| 2023/0005882 | A1 | 1/2023 | Vergis et al. |
| 2023/0353151 | A1 | 11/2023 | Lee et al. |

OTHER PUBLICATIONS

Intel compression mount technology—An overview—_Underfox_ Dec. 1-10, 2024.*
Extended European Search Report for Patent Application No. 23170057.6, Mailed Oct. 31, 2023, 8 pages.
First Office Action for U.S. Appl. No. 17/354,540, Mailed Aug. 13, 2024, 16 pages.
Notice of Allowance for U.S. Appl. No. 17/354,540, Mailed Mar. 24, 2025, 8 pages.
First Office Action for U.S. Appl. No. 17/902,740, Mailed Nov. 5, 2025, 11 pages.

\* cited by examiner

GDDR MEMORY EXPANDER USING CMT CONNECTOR

CLAIM OF PRIORITY

This application claims the benefit of the filing date of U.S. Provisional Application No. 63/348,956, filed Jun. 3, 2022, entitled "GDDR memory expander using CMT connector" under 35 U.S.C. § 119(e). U.S. Provisional Application No. 63/348,956 is further incorporated herein in its entirety for all purposes.

BACKGROUND INFORMATION

GDDR (Graphics Double Date Rate) based memory is used as a cost-effective memory for high bandwidth per capacity applications primarily in graphics and GPU (Graphics Processor Unit) accelerator applications. Under most current GDDR implementations there is no way to replace or upgrade the memory. For example, in the case of the memory soldered down to a printed circuit board (PCB) such as on a graphics or accelerator card, the graphics memory cannot be replaced in the event of a memory issue (e.g., failure) or to increase the amount of memory. Rather, this would require replacing the entire card including the GPU, which can be expensive.

Another approach is to use GDDR memory on an SO-DIMM (Small Outline Dual In-line Memory Module). This enables graphics memory to be replaced, but has limited bandwidth and reliability.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figures 1A, 1B:
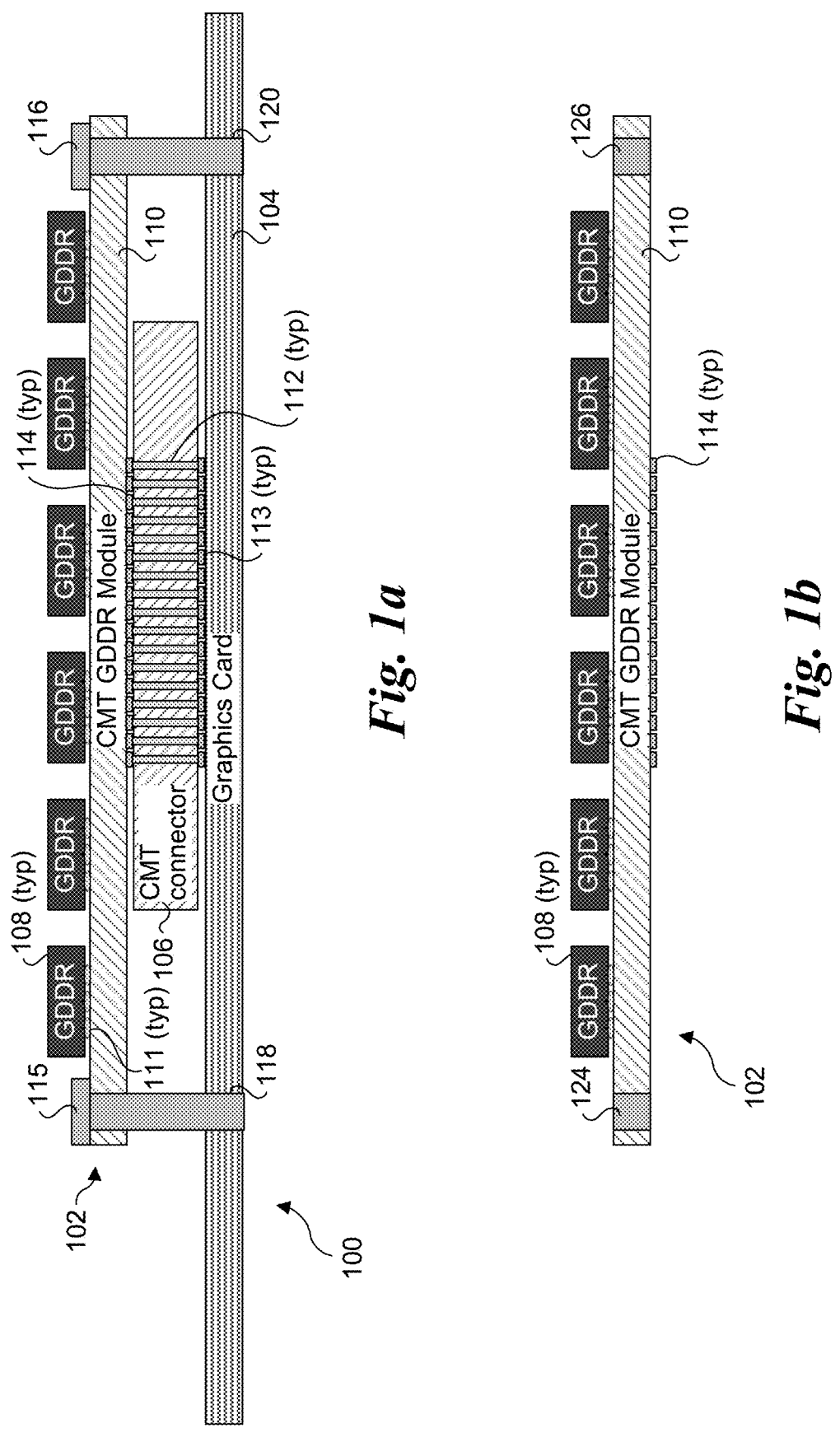
FIG. 1a is a diagram showing a cross-section view of an assembly including a CMT GDDR module coupled to a graphics card via a CMT connector, according to one embodiment.
FIG. 1b is a diagram showing a cross-section view illustrating further details of the CMT GDDR module, according to one embodiment.

Embodiments of methods and apparatus for GDDR memory expander using compression mount technology (CMT) connectors are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with an aspect of the embodiments described and illustrated herein a CMT connector with a dedicated pinout for GDDR-based memory is provided that enables end users and manufacturers to change the amount of GDDR memory provided with a GPU card, accelerator card, or apparatus having other form factors. Memory could also be replaced in the event of a failure. In addition, embodiments are disclosed that support a split channel concept where there could be multiple devices (e.g., GDDR modules) with dedicated signals routed to each module.

A cross-section view of an assembly 100 including a CMT GDDR module 102 coupled to a graphics card 104 via a CMT connector 106 is shown in FIG. 1a. CMT GDDR module 102 includes multiple GDDR memory devices 108 (e.g., GDDR6 memory chips) coupled to a substrate 110. In one embodiment, GDDR memory devices 108 are mounted to solder pads on the top surface of substrate 110 (not shown) using solder bumps 111. Other types of packaging technologies may also be used. CMT connector includes an array of CMT pins 112 that are spring-loaded at opposing ends and include lobes that contact respective CMT contact pads 113 on the top layer of graphics card 104 and CMT contact pads 114 on the underside of substrate 110. Assembly 100 is coupled together using a pair of screws 115 and 116 that are screwed into respective threads 118 and 120 in graphics card 104. In addition to the screws, a pair of alignment pins/dowels may also be used, such as shown in FIG. 2a and discussed below.

As shown in FIG. 1b, circuitry (e.g., wiring) formed in substrate 110 is used to couple signals and power between GDDR memory devices 108 and contact pads 114 on the underside of substrate 110. Contact pads 114 are arrayed in a pattern that matches the pattern used for CMT pins 112. In one embodiment a CMT pin 112 comprises a pair of spring contacts such as shown in FIG. 2c below that are inserted into opposing ends of a tube. As further shown in FIG. 1b, a pair of through holes 124 and 126 are formed in substrate 110 of CMT GDDR module 102. Holes 124 and 126 are sized to be fit the shoulder diameter of screws 114. Generally, the CMT connector size and pin count will be a function of the number of GDDR memory devices and their signal connector requirements.

Figures 2A, 2B, 2C:
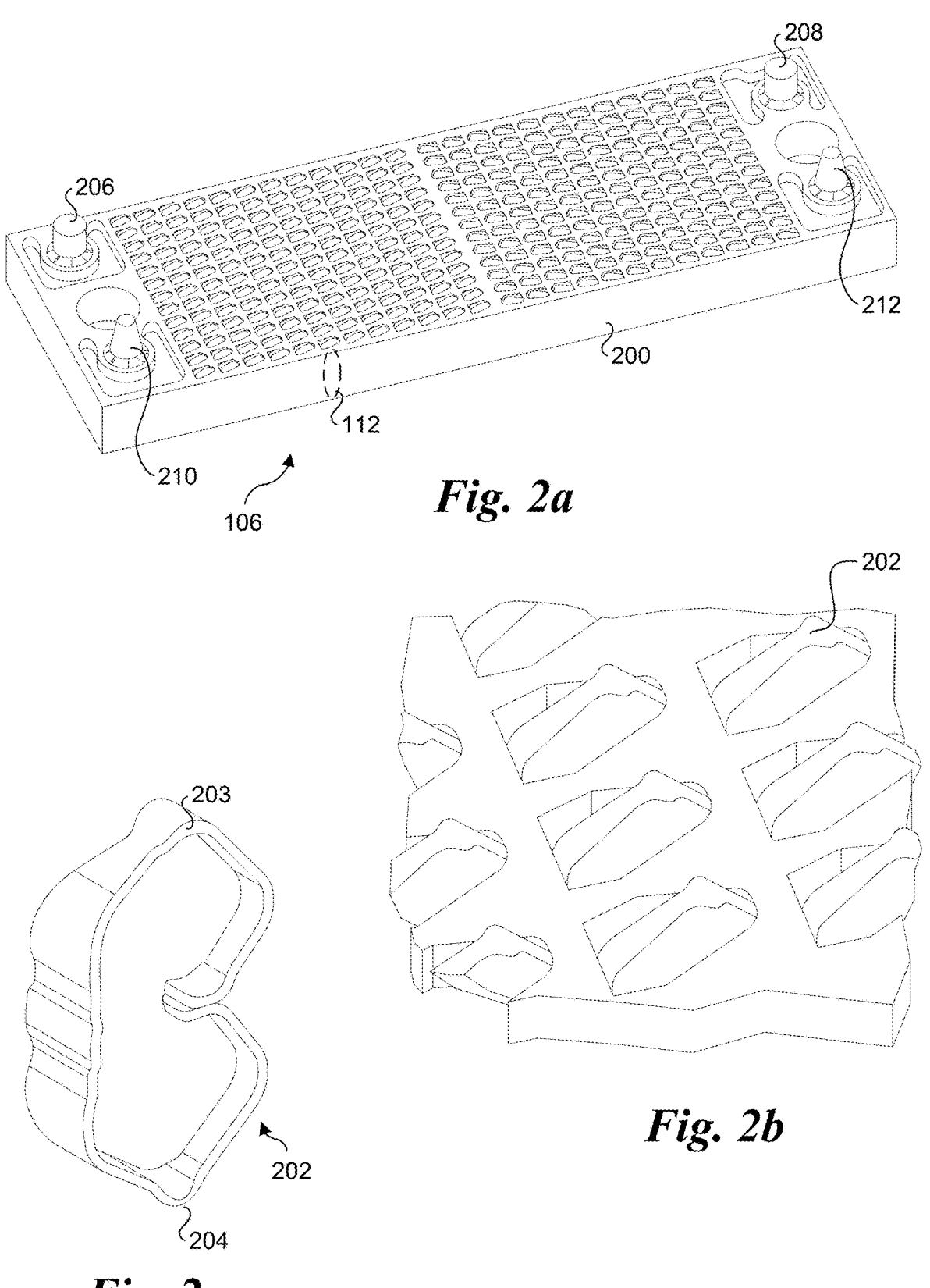
FIG. 2a shows a 3D view of a CMT connector, according to one embodiment
FIG. 2b shows a close-up view of the top of the spring contact structure used for the CMT pins.
FIG. 2c shows a 3D view of a spring contact used for the CMT pins, according to one embodiment.

FIG. 2a shows a three-dimensional (3D) view of a CMT connector 106, according to one embodiment. CMT connector 106 includes a body 200 in which arrays of CMT pins 112 are installed. As shown in FIGS. 2b and 2c, the CMT pins include a pair of spring contacts that are installed in opposing ends of tubes that are compressed when CMT connector 106 is installed in assembly 100 and other assemblies shown herein. As shown in FIG. 2c, a spring contact 202 comprises a bent structure made of a suitable metal and includes a pair of lobes 203 and 204; when two spring contacts 202 are installed in a tube and the components of assembly 100 are assembled, lobe 203 will contact a contact pad 114 on CMT GDDR module 102 while lobe 204 will contact a contact pad 113 on graphics card 104. The tubes are disposed in respective holes in body 200, and the spring contacts 202 are inserted into the opposing ends of the tubes.

As further shown in FIG. 2a, CMT connector 106 includes four alignment pins or alignment dowels 206, 208, 210, and 212. There are mating holes for alignment pins/dowels 206, 208, 210, and 212 in substrate 110 that are not shown in FIGS. 1a and 1b. In some embodiments, alignment pins or dowels protrude outward from both the top and bottom of the CMT connector body, and are used to align the CMT pins with mating pads on components above and below the CMT connector.

Figure 3:
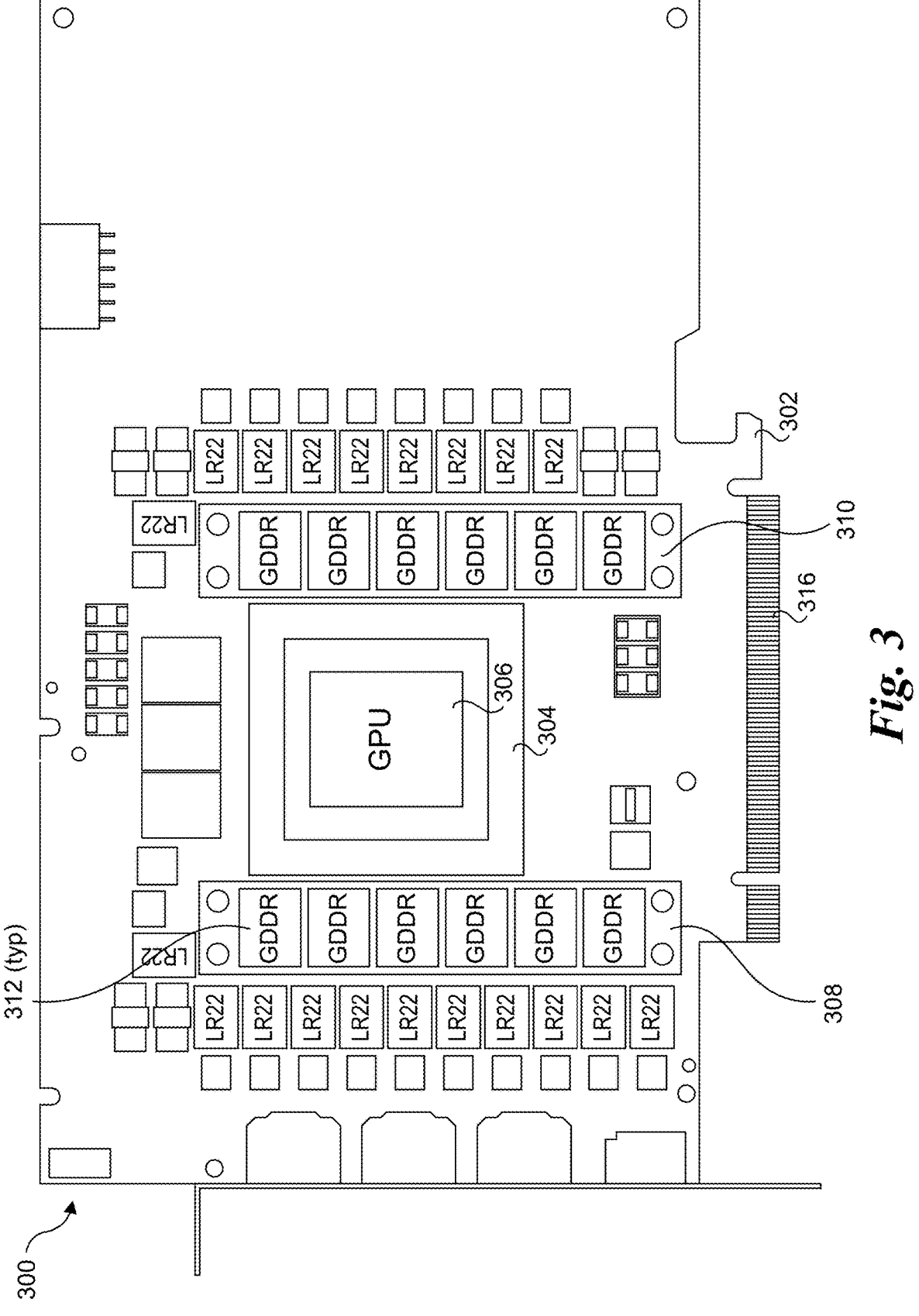
FIG. 3 is a diagram illustrating a graphics card including a GPU coupled to a pair of CMT GDDR modules via respective CMT connectors.

FIG. 3 shows implementation of a pair of CMT GDDR modules and associated CMT connectors in a graphics card 300. Graphics card 300 includes a PCB 302 to which various components are mounted or otherwise operatively coupled. For simplicity, only a portion of the components have reference numbers—those skilled in the art will recognize a graphics card will have various circuitry for voltage regulation, high-speed communication interfaces, capacitors, inductors (such as inductors labeled LR22), firmware, and other circuitry. A graphics card will also generally include cooling means, such as one or more fans, heatsinks, liquid cooler, and/or other means for keeping the GPU and other circuitry cool (not separately shown).

The labeled components include a GPU package 304 including a GPU 306 that is mounted to PCB 302 via a ball grid array (BGA) or the like, via a socketed connection, or via another means known in the art. For example, GPU package 304 may include an interposer comprising a BGA substrate to which a GPU chip is mounted.

Signal traces (e.g., wiring) in PCB 302 are used to provide signal paths between pads or pins on GPU package 304 and CMT pins in CMT connectors that are deposed under a pair of CMT GDDR modules 308 and 310. In one embodiment, the structure of assembly 100 in FIG. 1a is used. In this illustrated example, each of CMT GDDR modules 308 and 310 include six GDDR memory chips (such as but not limited to GDDR6 memory chips). In some embodiments of graphics cards and/or accelerator cards employing on or more GPU, all of the GDDR memory is provided via one or more CMT GDDR modules. In other embodiments, one or more CMT GDDR modules may include memory that is in addition to memory that is mounted to a graphic or accelerator card's PCB. In this example, PCB 302 includes a PCIe (Peripheral Component Interconnect Express) edge connector 316. However, this is merely exemplary, as other types of input-output (TO) interfaces and associated protocols may be used.

Each of on module CMT connectors 402 and 404 have a similar configuration and include an array of CMT pins 422 installed in respective holes in a connector body with spring contacts 424 extending above the body. Signal paths 426 and 428 are formed in respective CMT GDDR modules 408 and 410 to route signals between the on module CMT connectors 402, 404, and CMT connector 406, eventually reaching CMT contact pads 436 on motherboard 412. These signals are further connected to pads or pins on a CPU (Central Processing Unit) or GPU or XPU 430 mounted to motherboard 412 via wiring in motherboard 412 (wiring not shown). The signal paths to the GDDR memory devices that are coupled to the CMT contact pads are shown as stubs 432 and 434 for simplicity in FIG. 4-a representation of these signal paths are shown in FIG. 4b below. Under the routing paths that are illustrated, the signals between motherboard 412 that reach CMT GDDR modules 408 and 410 are split, enabling twice the amount of memory devices to be used within the same board footprint using the stacked structure employed by assembly 400.

Figure 4:
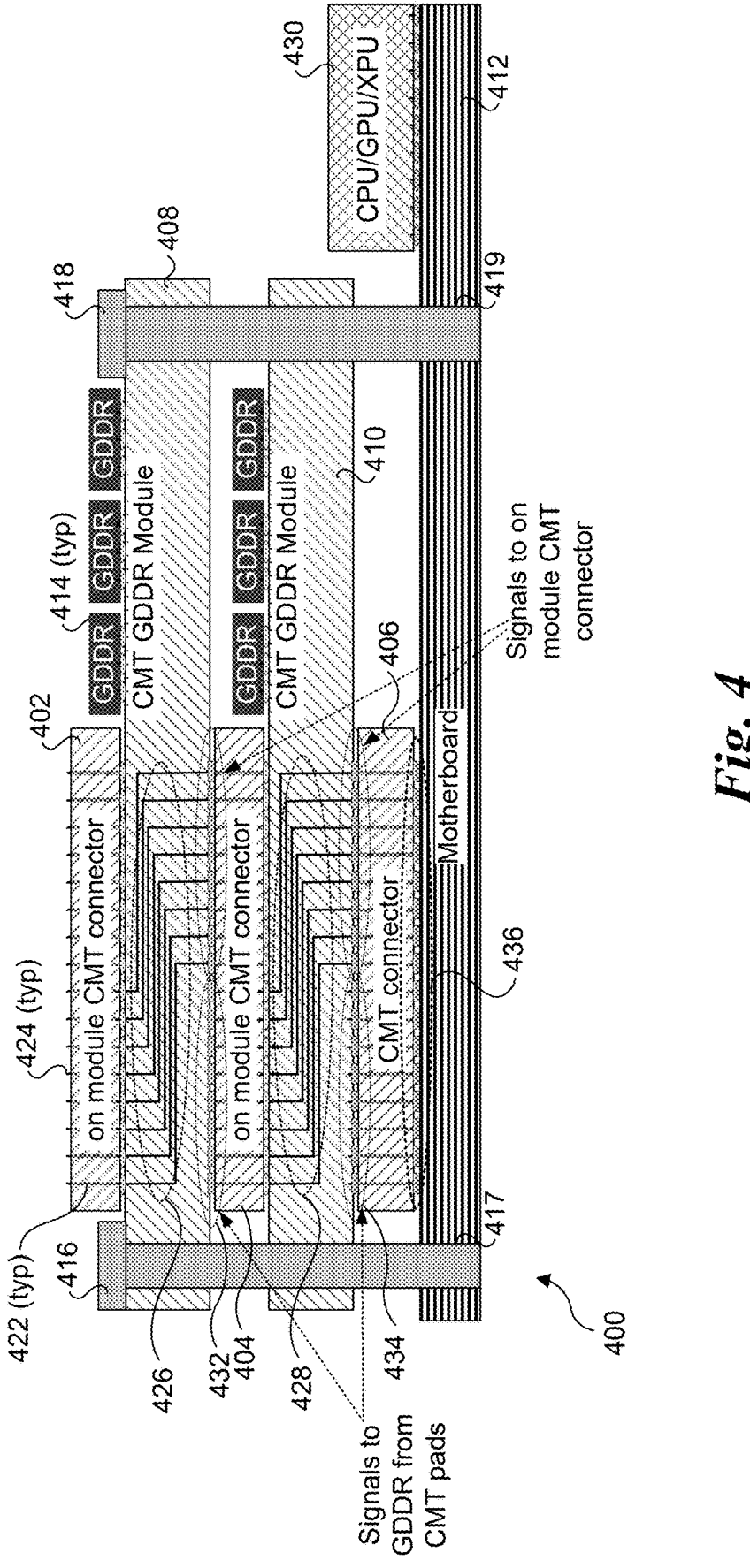
FIG. 4 is a diagram showing a cross-section view of an assembly comprising stacked CMT GDDR modules with on module CMT connectors, according to one embodiment.
Figures 4A, 4B:
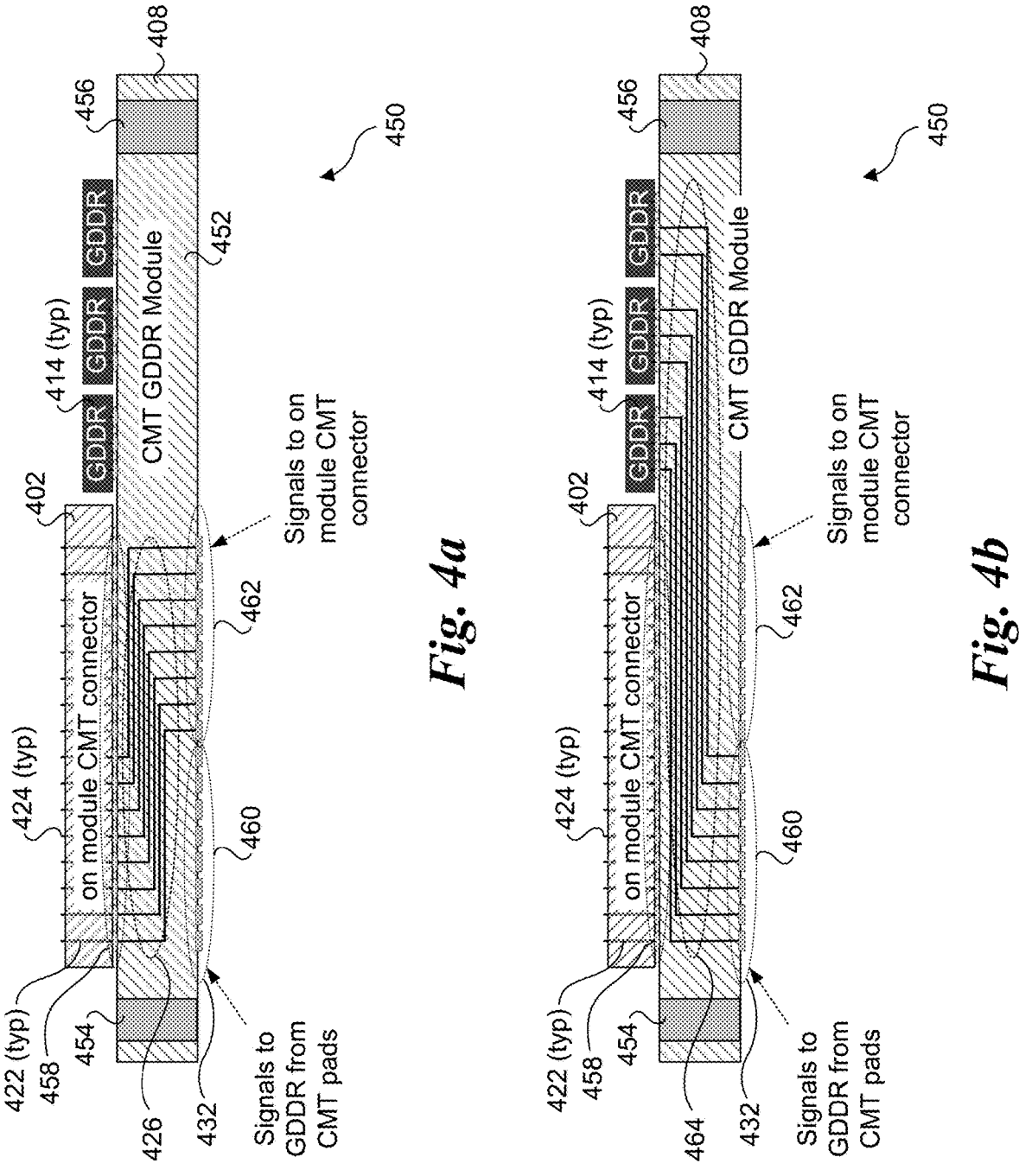
FIG. 4a is a cross-section view showing further details of an CMT GDDR module with an on module CMT connector illustrating signal paths connected to pins in the on module CMT connector.
FIG. 4b is a cross-section view showing further details of an CMT GDDR module with an on module CMT connector illustrating signal paths connecting pins of pads on GDDR memory devices to pads arrayed on the underside of the CMT GDDR module.

FIG. 4 shows a cross-section view of an assembly 400 comprising a stacked structure including a two on module CMT connector 402 and 404, a CMT connector 406, a pair of CMT GDDR modules 408 and 410, and a motherboard 412. In this example, CMT connector 402 is not being used but is shown to illustrate the stacked structure may be extended to support additional CMT GDDR modules and/or a CMT GDDR module with an on module CMT connector may be used as the top CMT GDDR module. Each of CMT GDDR modules 408 and 410 include multiple GDDR memory devices 414 (e.g., GDDR6 memory chips) that are mounted to a substrate or PCB using a known technique, such as using solder bumps. The assembly is coupled together via two or four screws, such as depicted by screws 416 and 418, which are threaded into respective threads 417 and 419 in motherboard 412. In one embodiment two screws and two guide pins are used.

Each of on module CMT connectors 402 and 404 have a similar configuration and include an array of CMT pins 422 installed in respective holes in a connector body with spring contacts 424 extending above the body. Signal paths 426 and 428 are formed in respective CMT GDDR modules 408 and 410 to route signals between the on module CMT connectors 402, 404, and CMT connector 406, eventually reaching motherboard 412. These signals are further connected to a pads or pins on a CPU (Central Processing Unit) or GPU or XPU 430 mounted to motherboard 412 via wiring in motherboard 412 (wiring not shown). The signal paths to the GDDR memory devices that are coupled to the CMT contact pads are shown as stubs 432 and 434 for simplicity in FIG. 4—a representation of these signal paths are shown in FIG. 4*b* below. Under the routing paths that are illustrated, the signals between motherboard 412 that reach CMT GDDR modules 408 and 410 are split, enabling twice the amount of memory devices to be used within the same board footprint using the stacked structure employed by assembly 400.

FIGS. 4*a* and 4*b* shows further details of an assembly 450 comprising CMT GDDR module 408 with on module CMT connector 402. CMT GDDR module 408 includes a substrate 452 (e.g., a PCB or any other type of suitable substrate) in which holes 454 and 456 are formed. In one embodiment, holes 454 and 456 are illustrative of 4 holes, two of which are sized for the shoulders of screws or other types of fasteners and two of which are size for alignment pins/dowels or the like.

Pins 422 include a conductive portion or member that extends downward below the CMT connector body into array of vias formed on top of substrate 452 and are coupled to respective signal paths 426 using an array of solder balls 458. For example, in one embodiment, a pin 422 includes a tube that extends below the connector body with a spring contact 424 inserted into a top portion of the tube. In another embodiment, pins 422 are a single piece with an integrated spring contact (or otherwise have a spring-type characteristic to enable the top of the pins to be compressed).

There are two arrays of CMT contact pads 460 and 462 formed on the underside of substrate 452. CMT contact pads in array 462 are connected to pins 422 via signal paths 426 formed in substrate 452. For simplicity, these paths are shown as two-dimensional (2D) paths. In practice, some of the paths may employ 3D routing. As will be recognized by those skilled in the PCB arts, 3D routing may employ a combination of internal vias that are connected via 2D path segments in different layers of substrate 452 (e.g., different layers of a PCB).

FIG. 4*b* shows 2D signal paths 464 that are coupled between pins or pads on GDDR devices 414 and CMT contact pads in array 460. As above, in practice signal paths 464 may employ 3D routing. It will also be recognized that the number of signal paths illustrated in the Figures herein are less than what would be used in an actual implementation.

Figure 4C:
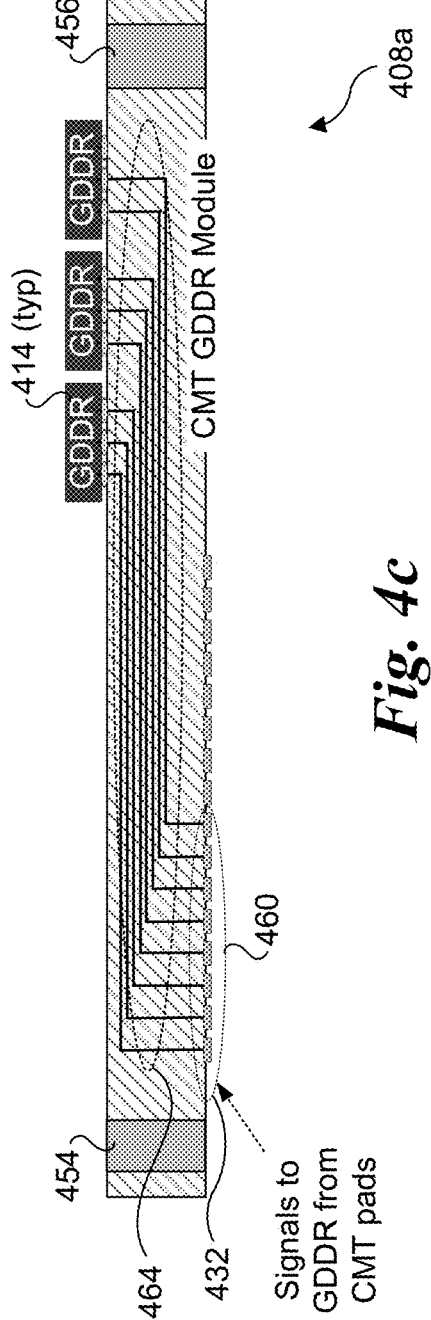
FIG. 4c is a cross-section view of a CMT GDDR module that may be used at the top of the assembly shown in FIG. 5.
Figure 5:
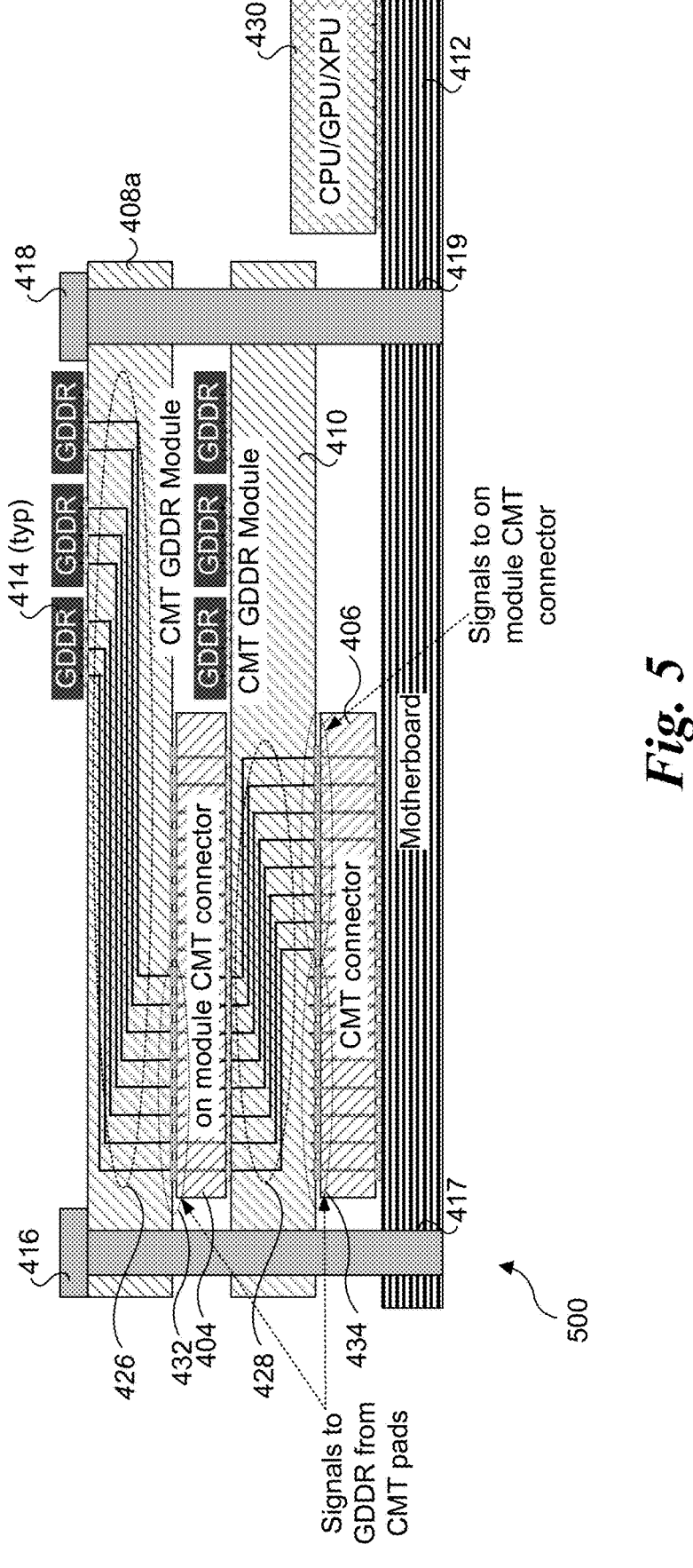
FIG. 5 is a diagram showing a cross-section view of an alternative configuration of the assembly of FIG. 4, where the top CMT GDDR module does not include an on module CMT connector, according to one embodiment.

FIG. 5 shows an alternative embodiment of an assembly 500, wherein CMT GDDR module 408 with on module CMT connector 402 has been replaced by a CMT GDDR module 408*a* that does not include an on module CMT connector. As shown in FIG. 4*c*, the configuration and structure of CMT GDDR module 408*a* is similar to CMT GDDR module 408, except CMT GDDR module 408*a* does not include signal paths 426 nor vias that would be connected to pins 422 via solder balls 458. Also, for a CMT GDDR module occupying the top of the stacked structure, GDDR memory devices 414 may be arranged different relative to their configuration for a CMT GDDR module in the middle of the stack and/or include additional GDDR memory devices 414. In embodiments where the top CMT GDDR module includes additional GDDR memory devices, the number of signal paths and CMT contact pads in both the top CMT GDDR module and the other components beneath is (including on module CMT connectors and CMT GDDR modules) would increase appropriately.

It will be recognized that under some embodiments, all pins in a CMT connector and associated CMT contact pads may not be used for carrying any signals or otherwise couple supply voltages or ground. This will enable use of off-the-shelf CMT connectors that may be available from different manufacturers, such as but not limited to Amphenol®. Of course, custom CMT connectors may also be used.

Generally, in addition to CPUs, the teaching and principles disclosed herein may be applied to Other Processing Units (collectively termed XPUs) including one or more of Graphic Processor Units (GPUs) or General Purpose GPUs (GP-GPUs), Tensor Processing Units (TPUs), Data Processing Units (DPUs), Infrastructure Processing Units (IPUs), Artificial Intelligence (AI) processors or AI inference units and/or other accelerators, FPGAs and/or other programmable logic (used for compute purposes), etc. While some of the diagrams herein show the use of GPUs, this is merely exemplary and non-limiting. Generally, any type of XPU may be used in place of a GPU in the illustrated embodiments. Moreover, as used in the following claims, the term "processor" is used to generically cover CPUs, GPUs, and various forms of other XPUs.

Generally, the CMT connector structures and arrangements described and illustrated herein may be used for coupling high-speed signals between various types of processor units and applicable types of graphics and/or accelerator memory. For example, the memory devices may include any current or future version of GDDR memory including GDDR5 SDRAM, GDDR6 SDRAM published by JEDEC (Joint Electronic Device Engineering Council) in July 2017, GDDR6× (developed by Micron® but yet to be published by JEDEC), GDDR6+, and GDDR7 (under current consideration by JEDEC). The JEDEC standards are available at www.jedec.org.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A card comprising:
   a printed circuit board (PCB) having a plurality of components and circuitry mounted or operationally coupled thereto and including one or more arrays of compression mount technology (CMT) contact pads;
   a processor, operatively coupled to the PCB, the processor having pins or pads that are electrically coupled to CMT contact pads in the one or more arrays of CMT contact pads via wiring in the PCB; and
   one or more CMT Graphic Double Data Rate (GDDR) modules, each including a plurality of GDDR memory devices mounted to a substrate, the GDDR memory devices communicatively coupled via wiring in the substate to an array of CMT contact pads formed on an underside of the substrate;
   wherein each of the one or more CMT GDDR modules is communicatively coupled to the PCB via a respective CMT connector interposed between the CMT GDDR module and the PCB proximate to an array of CMT contact pads on the PCB.

2. The card of claim 1, wherein a CMT connector has an array of spring-loaded pins, and wherein for each of at least a portion of the spring-loaded pins in the array, a contact at a first end of the pin is in compression contact with a respective CMT contact pad on the substrate of a CMT GDDR module and a contact on an opposing end of the pin is in contact with a respective CMT contact pad on the PCB.

3. The card of claim 1, wherein the processor comprises a Graphics Processor Unit (GPU).

4. The card of claim 1, wherein the processor comprises one of a Tensor Processing Unit (TPU), Data Processing Unit (DPU), Infrastructure Processing Unit (IPU), Artificial Intelligence (AI) processor, AI inference unit, or a Field Programmable Gate Array (FPGA).

5. The card of claim 1, wherein the GDDR memory devices comprise GDDR5 or GDDR6 SDRAM devices.

6. The card of claim 1, wherein the GDDR memory devices comprise GDDR6+or GDDR7 SDRAM devices.

7. The card of claim 1, wherein the substrate for a CMT GDDR module is mounted to the PCB via at least one pair of fasteners.

8. An apparatus, comprising:
   a printed circuit board (PCB) having a plurality of components and circuitry mounted or operationally coupled thereto and including one or more arrays of compression mount technology (CMT) contact pads;
   a processor, operatively coupled to the PCB, the processor having pins or pads that are electrically coupled to CMT contact pads in the one or more arrays of CMT contact pads via wiring in the PCB; and
   a first CMT Graphic Double Data Rate (GDDR) module including a plurality of GDDR memory devices and an on module CMT connector;
   a CMT connector interposed between the first CMT GDDR module and the PCB proximate to the one or more arrays of CMT contact pads on the PCB; and
   a second CMT GDDR module, operatively coupled to the on module CMT connector of the first CMT GDDR module.

9. The apparatus of claim 8, wherein the processor comprises a Graphics Processor Unit (GPU).

10. The apparatus of claim 8, wherein the processor is another processing unit (XPU) comprising one of a Tensor Processing Unit (TPU), Data Processing Units (DPU), Infrastructure Processing Unit (IPU), Artificial Intelligence (AI) processor, AI inference units, or a Field Programmable Gate Array (FPGA).

11. The apparatus of claim 8, wherein the GDDR memory devices comprise GDDR5, GDDR6, GDDR6+or GDDR7 SDRAM devices.

12. The apparatus of claim 8 wherein the first CMT GDDR module comprises:
   a substrate to which GDDR memory devices in the plurality of GDDR memory devices are mounted, the substrate having first and second arrays of CMT contact pads on an underside thereof;
   first wiring in the substrate communicatively coupling the GDDR memory devices to CMT contact pads in the first array of CMT contact pads;
   the on module CMT connector having an array of spring-loaded contacts, mounted to the first substrate; and
   second wiring in the substrate coupling spring-loaded contacts in the array of spring-loaded contacts to CMT contact pads in the second array of CMT contact pads.

13. The apparatus of claim 9, wherein the second CMT GDDR module has a configuration similar to the first CMT GDDR module including an on module CMT connector.

14. The apparatus of claim 9, wherein the second CMT GDDR module does not include an on module CMT connector.

15. The apparatus of claim 9, wherein the CMT connector has an array of spring-loaded pins, and wherein for each of at least a portion of the spring-loaded pins in the array, a contact at a first end of the pin is in compression contact with a respective CMT contact pad on the substrate of the first CMT GDDR module and a contact on an opposing end of the pin is in contact with a respective CMT contact pad on the PCB.

16. An apparatus, comprising:

a substrate to which multiple GDDR memory devices are mounted, the substrate having first and second arrays of CMT contact pads on an underside thereof;

first wiring in the substrate communicatively coupling the GDDR memory devices to CMT contact pads in the first array of CMT contact pads;

an on module CMT connector mounted to the substrate and having an array of spring-loaded contacts or pins extending above a top surface thereof; and second wiring in the substrate coupling the spring-loaded contacts or pins to CMT contact pads in the second array of CMT contact pads.

17. The apparatus of claim 16, wherein the spring-loaded contacts or pins include or are operatively coupled to conductive members extending downward below the on module CMT connector, and wherein the on module CMT connector is coupled to the substrate via an array of solder balls that are formed around the conductive members.

18. The apparatus of claim 16, wherein the GDDR memory devices comprise GDDR5, GDDR6, GDDR6+or GDDR7 SDRAM devices.

19. The apparatus of claim 16, wherein the substrate comprises a printed circuit board.

20. The apparatus of claim 16, wherein the substrate has a first pair of holes passing through the substate toward a first end and a second pair of holes passing through the substrate toward a second end.

\* \* \* \* \*